US012062385B2

(12) United States Patent
Rentschler et al.

(10) Patent No.: US 12,062,385 B2
(45) Date of Patent: Aug. 13, 2024

(54) TIME-SYNCHRONIZED HARDWARE CONTROLLERS AND RELATED AUDIO SYSTEMS AND CIRCUITRY

(71) Applicant: Microchip Technology Incorporated, Chandler, AZ (US)

(72) Inventors: Michael Rentschler, Baden-Wuerttemberg (DE); Thorben Link, Baden-Wuerttemberg (DE)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/305,561

(22) Filed: Jul. 9, 2021

(65) Prior Publication Data
US 2022/0013149 A1 Jan. 13, 2022

Related U.S. Application Data

(60) Provisional application No. 62/705,653, filed on Jul. 9, 2020.

(51) Int. Cl.
*G11B 27/10* (2006.01)
*G06F 1/04* (2006.01)
(Continued)

(52) U.S. Cl.
CPC ............. *G11B 27/10* (2013.01); *G06F 1/04* (2013.01); *G06F 1/12* (2013.01); *H03K 19/20* (2013.01);
(Continued)

(58) Field of Classification Search
CPC .. G11B 27/10; G06F 1/04; G06F 1/12; H03K 19/20; H04N 21/8106; H04N 21/8547
See application file for complete search history.

(56) References Cited

U.S. PATENT DOCUMENTS 5,666,323 A * 9/1997 Zagar ............. G11C 7/1039
365/230.06
6,611,537 B1 * 8/2003 Edens .............. H04N 21/4363
375/E7.274
(Continued)

FOREIGN PATENT DOCUMENTS

CN 105450384 A * 3/2016
JP 2004304410 A * 10/2004
(Continued)

OTHER PUBLICATIONS

International Search Report from International Application No. PCT/US2021/070857, mailed Nov. 2, 2021, 5 pages.
(Continued)

*Primary Examiner* — Metasebia T Retebo
*Assistant Examiner* — James G Yeaman
(74) *Attorney, Agent, or Firm* — TraskBritt

(57) ABSTRACT

Synchronization for audio systems and related systems and circuitry are disclosed. An audio system includes a word select line of a digital audio interface, a serial clock line of the digital audio interface, and hardware circuitry. The hardware circuitry is configured to provide a word select signal to the word select line and a serial clock signal to the serial clock line. The word select signal is configured to indicate channels of a serial data signal provided to a serial data line of the digital audio interface. The hardware circuitry is also configured to synchronize the serial clock signal to a clock reference stream of an audio stream communicated via a network interface.

17 Claims, 9 Drawing Sheets

(51) Int. Cl.
*G06F 1/12* (2006.01)
*H03K 19/20* (2006.01)
*H04N 21/81* (2011.01)
*H04N 21/8547* (2011.01)

(52) U.S. Cl.
CPC ..... *H04N 21/8106* (2013.01); *H04N 21/8547* (2013.01)

(56) References Cited

U.S. PATENT DOCUMENTS

| | | | |
|---|---|---|---|
| 7,805,210 B2 * | 9/2010 | Cucos | H04R 27/00 700/94 |
| 9,064,062 B2 * | 6/2015 | Kruiskamp | H04H 20/88 |
| 9,354,658 B2 * | 5/2016 | Machnicki | H03K 5/01 |
| 9,429,980 B2 * | 8/2016 | Yuenyongsgool | H03H 17/0642 |
| 2007/0143801 A1 * | 6/2007 | Madonna | H04L 12/2803 348/E5.002 |
| 2010/0077247 A1 * | 3/2010 | McHarg | G06F 1/12 713/400 |
| 2011/0228768 A1 | 9/2011 | Gelter et al. | |
| 2012/0120741 A1 * | 5/2012 | Kim | G11C 16/08 365/189.14 |
| 2014/0195651 A1 * | 7/2014 | Stockhammer | H04N 21/23439 709/219 |
| 2016/0006526 A1 * | 1/2016 | Cho | H04J 3/0697 370/503 |
| 2018/0285292 A1 * | 10/2018 | Amarilio | G06F 1/32 |

FOREIGN PATENT DOCUMENTS

| | | | |
|---|---|---|---|
| KR | 100423071 B1 * | 7/2004 | |
| TW | M324819 U * | 1/2008 | |
| WO | 2019/136076 A1 | 7/2019 | |

OTHER PUBLICATIONS

International Written Opinion from International Application No. PCT/US2021/070857, mailed Nov. 2, 2021, 16 pages.
Philips: "I2S bus specification", Internet Citation, (Jun. 5, 1996), retrieved from internet on Oct. 5, 2010 at URL: http://www.nxp.com/acrobat_download2/various/I2SBUS.pdf, 7 pages.

* cited by examiner

TIME-SYNCHRONIZED HARDWARE CONTROLLERS AND RELATED AUDIO SYSTEMS AND CIRCUITRY

CROSS-REFERENCE TO RELATED APPLICATION

This application claims the benefit under 35 U.S.C. § 119(e) of U.S. Provisional Patent Application No. 62/705,653, filed Jul. 9, 2020, and titled "TIME-SYNCHRONIZED I2S HARDWARE CONTROLLER," the entire disclosure of which is hereby incorporated herein by reference.

TECHNICAL FIELD

This disclosure relates generally to time-synchronized hardware controllers.

BACKGROUND

In some digital audio systems synchronization may be important. For example, audio may be synchronized with video in video streaming systems (e.g., so speech audio is synchronized with mouth movements shown in video, without limitation). As another example, digital signals used to generate analog audio signals delivered to different speakers in surround sound systems (e.g., automotive surround sound, professional audio equipment, without limitation) may be synchronized.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1:
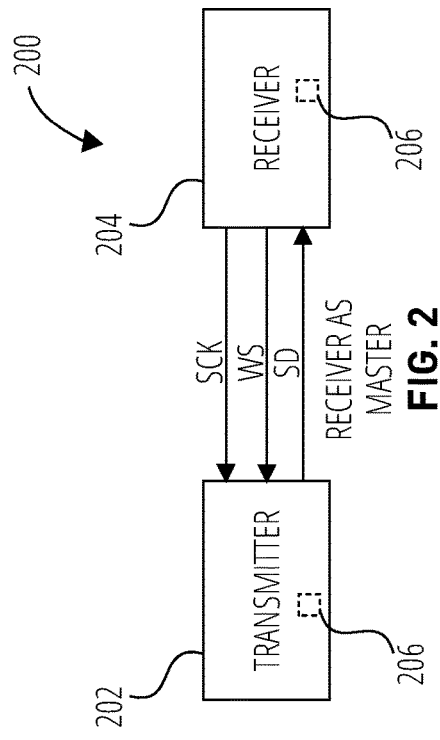
FIG. 1 is a block diagram of a transmitter as master I2S system, according to various examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," mean that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "hardware" refers to implementations including hardware elements and excluding software elements such as executable software or firmware code. For example, hardware may include discrete electrical components (e.g., resistors, capacitors, inductors, logic gates, diodes, transistors, other hardware elements, or combinations thereof).

Inter-IC Sound (I2S) is a standard for a digital serial bus that may be used to interface digital audio devices (e.g., integrated circuits (ICs), without limitation) to each other. According to the Time-Sensitive Network (TSN) International Electronics and Electrical Engineers (IEEE) 802.1 standard, audio listener applications may receive audio streams (e.g., as set forth in the IEEE 1722 or 1733 standards) from the network along with a clock reference stream including a reference clock. The received audio samples are transferred through an I2S interface to an audio device (e.g., a digital signal processor (DSP), an amplifier, without limitation) for playback. The I2S clock is synchronous with the reference clock, and the listener physically recovers this clock from the received stream data. Clock recovery uses a phased locked loop (PLL) to obtain the final audio bit clock (I2S MCK/SCK) by multiplying the recovered reference clock by some constant factor. In some instances, the clock recovery is started in front of the audio transfer for playback, and is run until the PLL is able to clock to the given reference clock. I2S does not permit audio transmission before this point is reached.

Certain problems exist in synchronizing between an I2S clock and data for listener use cases. For example, at the start of I2S streaming, the data and clock may be aligned. Any error during the start of streaming will persist for the entire duration of streaming. Using software solutions, which would be relatively complicated, it is possible to synchronize the I2S clock and the data for listener use cases to within microsecond precision. Hardware solutions disclosed herein, however, provide nanosecond precision in synchronizing the I2S clock and the data for listener use cases.

Certain problems may exist in synchronizing between captured frame synchronization- (FSY-) timestamps and the input stream of audio samples. Capturing the timestamps may take place asynchronously to the I2S stream. If the I2S transmitter is the clock master, then software may not be able to reliably recover the relationship between sample and timestamp.

The inventors of this disclosure appreciate that the use of software solutions to define a starting point of an I2S transmission to enable synchronizing of the I2S clock to the stream reference clock would introduce jitter and cause difficulty when worst-case timing constraints must be guaranteed. Software solutions may be relatively complex to guarantee hard timings and may introduce a range of timing uncertainty (e.g., due to interrupt delays, without limitation) that may be unacceptable or undesirable in some use cases.

In some instances, audio may be streamed over Ethernet networks. Relatively high synchronicity may be desired between multiple audio endpoints (e.g., surround sound systems, without limitation), or to synchronize mouth movements to audio in video streaming. Related streaming protocol standards include IEEE 1722 (Audio Video Transport Protocol (AVTP)) and IEEE 1733 (Real-time Transport Protocol (RTP)) in combination with some timing protocols such as IEEE 1588 (Precision Time Protocol (PTP)) or IEEE 802.1AS (generalized PTP (gPTP)).

Various examples disclosed herein may improve synchronicity of media streaming devices by achieving a small (e.g., the smallest possible, without limitation) timing uncertainty in presentation time of audio listeners and allowing precise (e.g., substantially exact, without limitation) synchronization between sample data and timestamps of audio talkers. Various examples disclosed herein may simplify stream synchronization by offloading complexity from a CPU (e.g., a processing core of a microcontroller, without limitation). Hardware solutions, in contrast to software solutions, may reliably guarantee fixed numbers and lower uncertainty. Software solutions would introduce interrupt latency that is at least partially avoided in various examples of hardware solutions disclosed herein.

Various examples disclosed herein enable synchronization of an I2S clock to a stream reference clock based on a synchronized time base. Implementations of various examples disclosed herein may involve extension to I2S hardware peripherals in MCUs, which enables synchronization of the start of an I2S transmission (clock output enable) to a specific time point. Various examples disclosed herein are directed to hardware mechanisms in contrast to software mechanisms. Accordingly, at least some undesired time shifts, jitter, and poor worst-case-timings associated with software mechanisms may be avoided. Hardware-based mechanisms may guarantee high (e.g., highest possible, without limitation) precision of synchronization between sample data and timestamps of audio talkers. This is the case especially where multiple audio listener nodes play back audio synchronously.

In various examples, an I2S controller that is configured to synchronize its I2S clock to the actual start time is integrated. I2S clocks are derived from an external clock source, which is a multiple of the final audio bit block and is recovered from the audio reference clock.

In various examples, an audio system includes a word select line of a digital audio interface, a serial clock line of the digital audio interface, and hardware circuitry. The hardware circuitry is configured to provide a word select signal to the word select line. The word select signal is configured to indicate channels of a serial data signal provided to a serial data line of the digital audio interface. The hardware circuitry is configured to provide a serial clock signal to the serial clock line and synchronize, at least partially based on a synchronized time base, the serial clock signal to a clock reference stream of an audio stream communicated via a network interface.

In various examples, circuitry for controlling timing of communications includes a serial clock line, an enable gate, and an event generator. The enable gate is electrically connected to the serial clock line. The enable gate is configured to start provision of a serial clock signal to the serial clock line based, at least in part, on an assertion of a synchronization signal. The event generator is configured to assert the synchronization signal responsive to a presentation time stamp from a serial data signal. The presentation time stamp is correlated to a synchronized time base. The enable gate and the event generator are implemented using hardware circuitry.

FIG. 1 is a block diagram of a transmitter as master I2S system 100, according to various examples. The transmitter as master I2S system 100 includes a transmitter 102 and a receiver 104. The transmitter 102 and the receiver 104 are I2S endpoints configured to communicate (e.g., via an Ethernet network, without limitation) using an I2S protocol. The transmitter 102 is configured to operate as a master node in the transmitter as master I2S system 100. As the master node, the transmitter 102 is configured to transmit a serial clock signal SCK and a word select signal WS to the receiver 104. The transmitter 102 is configured to transmit a serial data signal SD to the receiver 104. One or both of the transmitter 102 and the receiver 104 may include a time-synchronized hardware controller 106 according to various examples discussed herein.

The serial data signal SD may include serial data (e.g., serial audio data corresponding to an audio stream, without limitation). The receiver 104 is configured to use the serial clock signal SCK and the word select signal WS received from the transmitter 102 to synchronize the serial data of the serial data signal SD.

Figure 2:
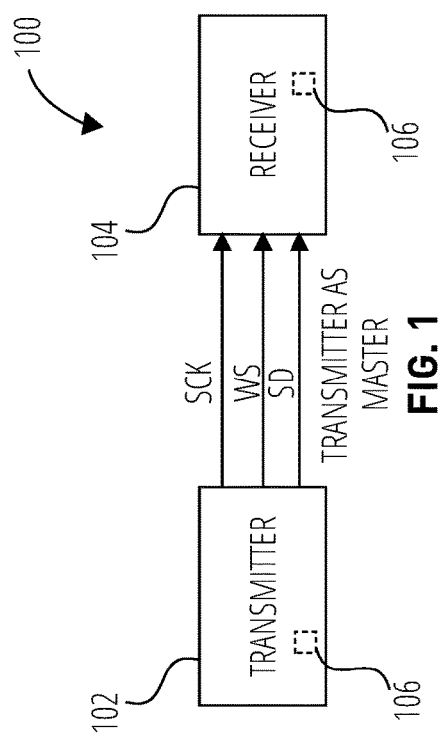
FIG. 2 is a block diagram of a receiver as master I2S system, according to various examples.

FIG. 2 is a block diagram of a receiver as master I2S system 200, according to various examples. The receiver as master I2S system 200 includes a transmitter 202 and a receiver 204 similar to the transmitter 102 and the receiver 104 of FIG. 1. Similar to the transmitter 102 and the receiver 104 of FIG. 1, the transmitter 202 and the receiver 204 are I2S endpoints configured to communicate (e.g., via an Ethernet network, without limitation) using an I2S protocol. In contrast to the receiver 104 of transmitter as master I2S system 100 of FIG. 1, the receiver 204 is configured to operate as a master node in the receiver as master I2S system 200, as the master node the receiver 204 is configured to transmit a serial clock signal SCK and a word select signal WS to the receiver 204. One or both of the transmitter 202 and the receiver 204 may include a time-synchronized hardware controller 206 according to various examples discussed herein.

Similar to the transmitter 102 of FIG. 1, the transmitter 202 is configured to transmit a serial data signal SD to the receiver 204. The transmitter 102 is configured to synchronize the serial data signal SD responsive to the serial clock signal SCK and the word select signal WS received from the receiver 204.

Figure 3:
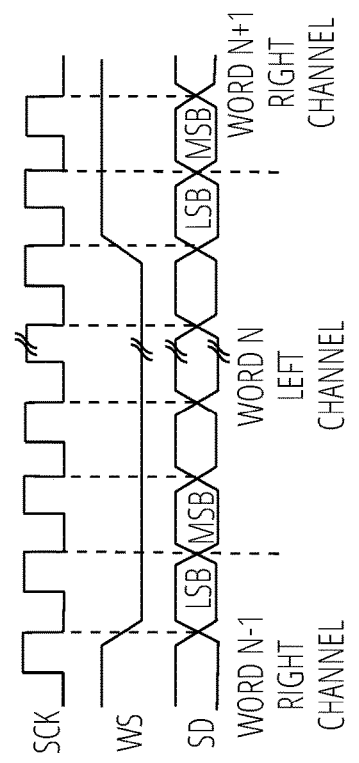
FIG. 3 is a block diagram of a controller as master I2S system, according to various examples.

FIG. 3 is a block diagram of a controller as master I2S system 300, according to various examples. The controller as master I2S system 300 includes a transmitter 302 and a receiver 304 similar to the transmitter 102 and the receiver 104 of FIG. 1. Similar to the transmitter 102 and the receiver 104 of FIG. 1 and the transmitter 202 and the receiver 204 of FIG. 2, the transmitter 302 and the receiver 304 are I2S endpoints configured to communicate (e.g., via an Ethernet network, without limitation) using an I2S protocol. In contrast to the transmitter as master I2S system 100 of FIG. 1 and the receiver as master I2S system 200 of FIG. 2, the controller as master I2S system 300 includes a controller 306 configured to operate as a master node in the controller as master I2S system 300. As the master node, the controller 306 is configured to transmit a serial clock signal SCK and a word select signal WS to the transmitter 302 and the receiver 304. Accordingly, the controller 306 is configured to operate as a stand-alone I2S controller, which works in conjunction with state of the art I2S peripherals (e.g., the transmitter 302 and the receiver 304, without limitation).

Similar to the transmitter 102 of FIG. 1 and the transmitter 202 of FIG. 2, the transmitter 302 is configured to transmit a serial data signal SD to the receiver 304. The transmitter 302 and the receiver 304 are configured to synchronize the serial data signal SD responsive to the serial clock signal SCK and the word select signal WS received from the controller 306.

Figure 4:
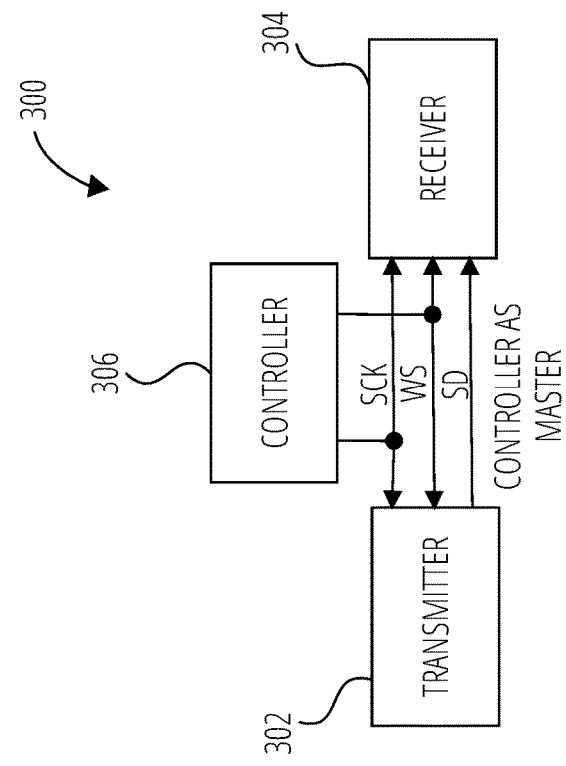
FIG. 4 is a signal timing diagram of I2S signals of the transmitter as master I2S system of FIG. 1, the receiver as master I2S system of FIG. 2, and the controller as master I2S system of FIG. 3, according to various examples.

FIG. 4 is a signal timing diagram of I2S signals 400 of the transmitter as master I2S system 100 of FIG. 1, the receiver as master I2S system 200 of FIG. 2, and the controller as master I2S system 300 of FIG. 3, according to various examples. The I2S signals 400 include the serial clock signal SCK, the word select signal WS, and the serial data signal SD. By way of non-limiting example, the serial data signal SD may be transmitted as a two's compliment signal. The serial data signal may include words (e.g., a word N−1 right channel, a word N left channel, a word N+1 right channel, without limitation). Each word may begin with a most significant bit MSB and end with a least significant bit LSB.

The word select signal WS is configured to indicate an audio channel (e.g., a left audio channel and a right audio channel of a stereo audio system, without limitation) that serial data in the serial data signal SD being transmitted corresponds to. As a non-limiting example, the word select signal WS may indicate with a "one" (e.g., a logic level high voltage potential, without limitation) that the serial data transmitted in the serial data signal SD corresponds to a right channel. Also, the word select signal WS may indicate with a "zero" (e.g., a logic level low voltage potential, without limitation) that the serial data transmitted in the serial data signal SD corresponds to a left channel.

The serial clock signal SCK and the word select signal WS enable the I2S endpoints to synchronize the serial clock signal SCK and the serial data signal SD to a reference clock of a media stream with a relatively high level of precision.

Figure 5:
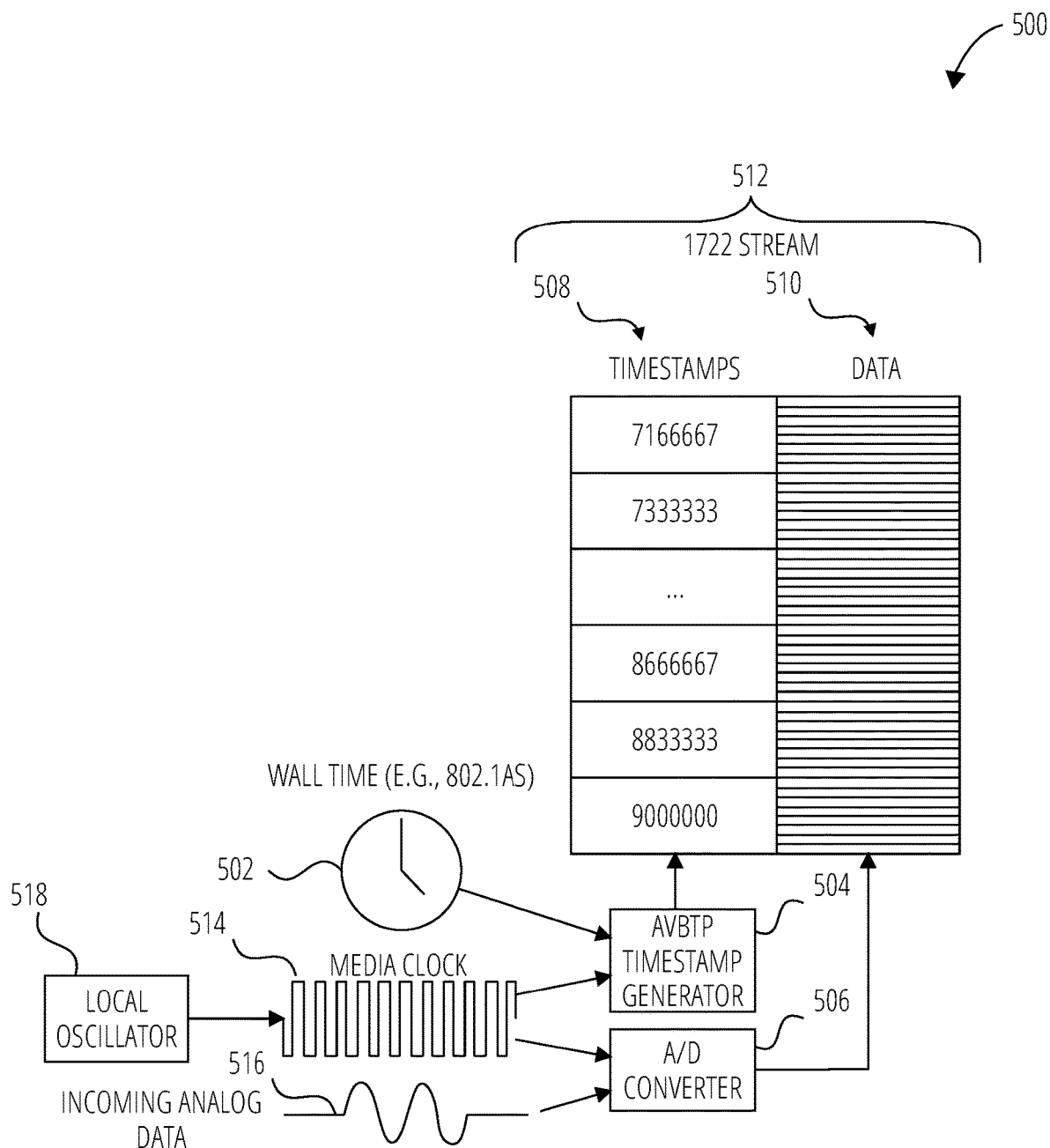
FIG. 5 is a block diagram of an AVTP talker, according to various examples.

FIG. 5 is a block diagram of an AVTP talker 500, according to various examples. The AVTP talker 500 includes a local oscillator 518, an audio video bridging (AVB) transport protocol (AVBTP) timestamp generator (AVBTP timestamp generator 504), and an analog to digital (A/D) converter (A/D converter 506). The AVTP talker 500 is configured to generate an IEEE 1722 data stream (1722 stream 512) including timestamps 508 and data 510.

The local oscillator 518 (e.g., a voltage-controlled oscillator, without limitation) is configured to generate a media clock 514. The AVBTP timestamp generator 504 and the A/D converter 506 are configured to receive the media clock 514 from the local oscillator 518. The A/D converter 506 is also configured to receive incoming analog data 516 (e.g., analog audio data, without limitation) and convert the incoming analog data 516 to data 510 (digital data) to be included in the 1722 stream 512 responsive to the incoming analog data 516 and the media clock 514. The AVBTP timestamp generator 504 is configured to generate the timestamps 508 for the data 510 responsive to the media clock 514 and wall time 502 (e.g., IEEE 802.1AS network time, without limitation). The 1722 stream 512 includes the timestamps 508 and the data 510.

The timestamps 508 indicate values of the wall time 502 corresponding to bits of the data 510. As a non-limiting example, the values of the timestamps 508 may indicate values of the wall time 502 at which the values of the data 510 were sampled by the A/D converter 506. By way of non-limiting example, the timestamps 508 illustrated in FIG. 5 include wall time values of U.S. Pat. Nos. 7,166,667, 7,333,333, . . . , 8666667, 8833333, and 9000000. Also by way of non-limiting example, the timestamps 508 may be captured per a certain number of data 510 samples captured (e.g., one timestamp for every six or eight data 510 samples, without limitation).

The AVTP talker 500 may be configured to operate as an I2S transmitter (e.g., the transmitter 102 of FIG. 1, the transmitter 202 of FIG. 2, or the transmitter 302 of FIG. 3, without limitation). The 1722 stream 512 may be transmitted to an audio device (e.g., an I2S receiver, without limitation) using an I2S protocol. Accordingly, the 1722 stream 512 may be transmitted from a transmitter (e.g., the transmitter 102 of FIG. 1, the transmitter 202 of FIG. 2, or the transmitter 302 of FIG. 3, without limitation) to a receiver (e.g., the receiver 104 of FIG. 1, the receiver 204 of FIG. 2, or the receiver 304 of FIG. 3, without limitation) as a serial data signal SD (e.g., the SD of FIG. 1, FIG. 2, FIG. 3, or FIG. 4, without limitation) of an I2S interface.

Figure 6:
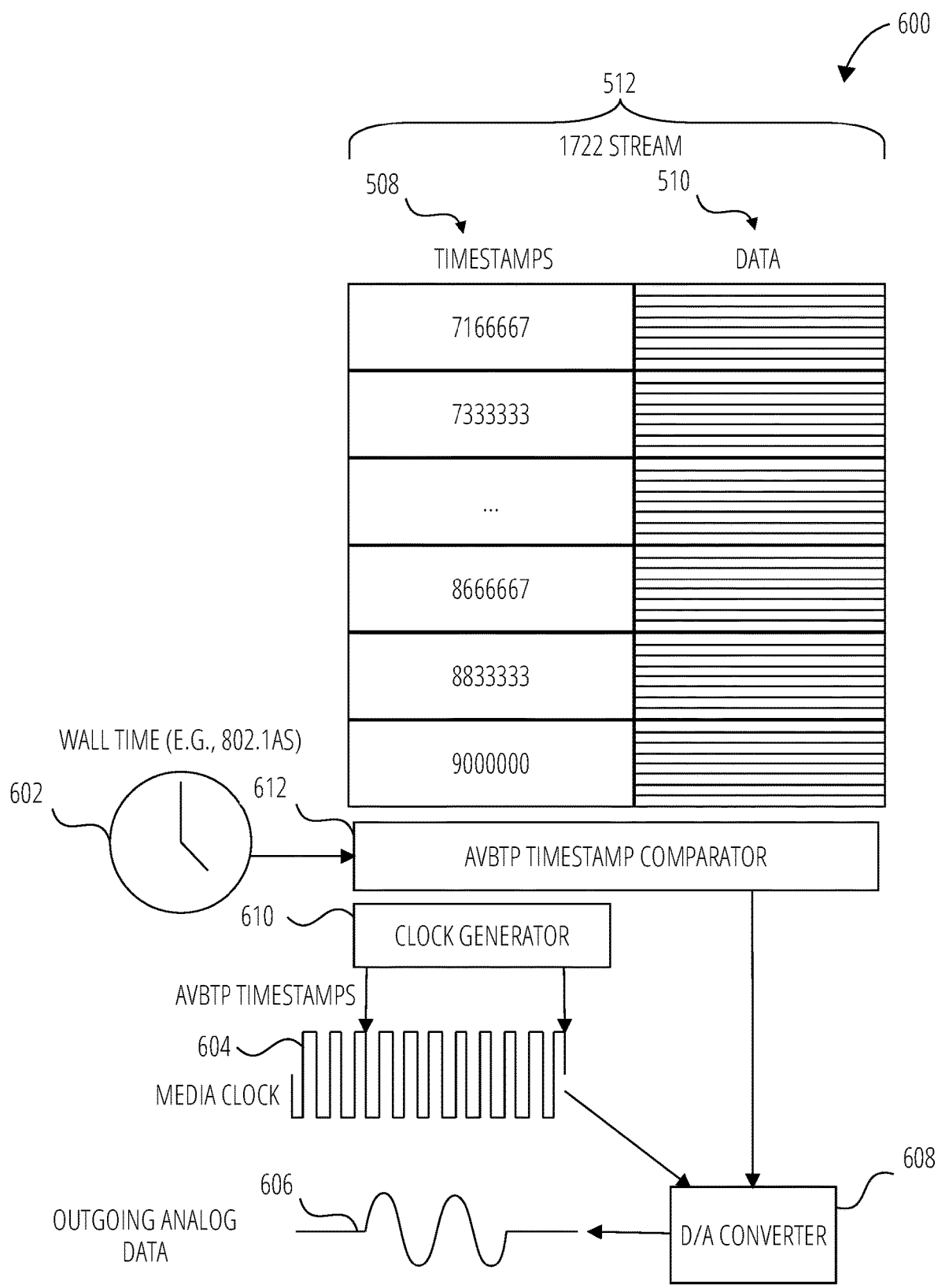
FIG. 6 is a block diagram of an AVTP listener, according to various examples.

FIG. 6 is a block diagram of an AVTP listener 600, according to various examples. The AVTP listener 600 may be configured to operate as an I2S receiver (e.g., the receiver 104 of FIG. 1, the receiver 204 of FIG. 2, or the receiver 304 of FIG. 3, without limitation). The AVTP listener 600 may be configured to receive the 1722 stream 512 from the AVTP talker 500 of FIG. 5. The AVTP listener 600 is configured to extract outgoing analog data 606 responsive to the 1722 stream 512.

The AVTP listener 600 includes an AVBTP timestamp comparator 612, a clock generator 610, and a digital to analog (D/A) converter (D/A converter 608). The AVBTP timestamp comparator 612 is configured to compare a wall time 602 (e.g., an 802.1AS network time synchronized with the wall time 502 of FIG. 5 using, without limitation, a PTP) to the timestamps 508 of the 1722 stream 512. The wall time 602 of the AVTP listener 600 may be synchronized with the wall time 502 of the AVTP talker 500 of FIG. 5.

The clock generator 610 is configured to generate a media clock 604, which is a recovered version of the media clock 514 of the AVTP talker 500 of FIG. 5. The D/A converter 608 is configured to generate outgoing analog data 606 responsive to the media clock 514 and the comparison between the wall time 602 and the timestamps 508 from the 1722 stream 512. The outgoing analog data 606 may be synchronized to the media clock 604 based on the comparison between the wall time 602 and the timestamps 508.

Figure 7:
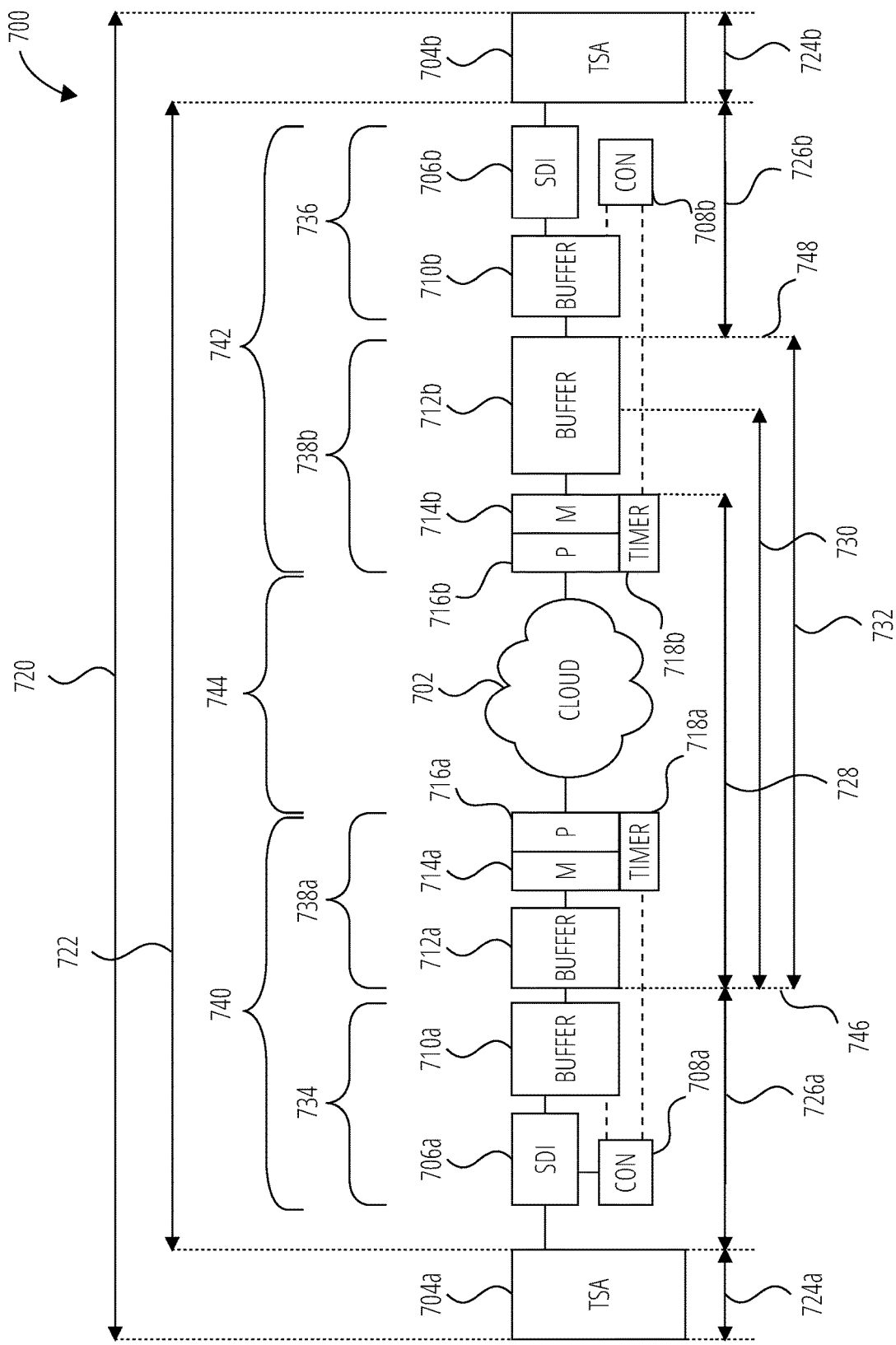
FIG. 7 is a block diagram of timing reference planes, according to various examples.

FIG. 7 is a block diagram of timing reference planes 700 (e.g., AVTP timing reference planes, without limitation), according to various examples. FIG. 7 illustrates an ingress time reference plane 746, a presentation time reference plane 748, timestamp measurement planes 744 (e.g., gPTP timestamp measurement planes, without limitation), a talker 740 (e.g., an AVTP talker, without limitation), a listener 742 (e.g., an AVTP listener, without limitation), and time-sensitive applications 704a and 704b. The talker 740 includes a stream packetizer 734 (e.g., an AVTP stream packetizer, without limitation) and a network interface 738a (e.g., an AVTP network interface, without limitation). The stream packetizer 734 includes a streaming data interface 706a, a buffer 710a (e.g., including data samples, without limitation), and a control 708a. The network interface 738a includes a buffer 712a (e.g., including 1722 packets, without limitation), a media access control layer (MAC 714a), a physical layer (PHY 716a), and a timer 718a (e.g., an 802.1AS timer, without limitation).

The listener 742 includes a network interface 738b (e.g., an AVTP network interface, without limitation) and a stream depacketizer 736 (e.g., an AVTP stream depacketizer, without limitation). The network interface 738b includes a PHY 716b, a MAC 714b, a timer 718b (e.g., an 802.1AS timer, without limitation), and a buffer 712b (e.g., including 1722 packets, without limitation). The stream depacketizer 736 includes a buffer 710b (e.g., including data samples, without limitation), a streaming data interface 706b, and a control 708b.

FIG. 7 illustrates various latencies (e.g., jack-to-jack latency 720, application-to-application latency 722, without limitation), timing information (e.g., application times 724a and 724b, format conversion times 726a and 726b, a minimum transit time 728, an actual transit time 730 (variable), and a maximum transit time 732, without limitation) involved with streaming data from the time-sensitive application 704a associated with the talker 740 (e.g., the AVTP talker 500 of FIG. 5) to the time-sensitive application 704b associated with the listener 742 (e.g., the AVTP listener 600 of FIG. 6, without limitation) through a cloud 702 (e.g., an 802.1 AVB/TSN cloud, without limitation).

There may be uncertainty in a maximum timing due to variability in transfer of a packet's ownership. In the ingress time reference plane 746, ownership of a fully prepared 1722 packet is transferred to the network interface 738a for transmission at a time no later than presentation. In the presentation time reference plane 748, the 1722 packet is guaranteed to be written into the buffer no later than the maximum transmit time.

Figure 8:
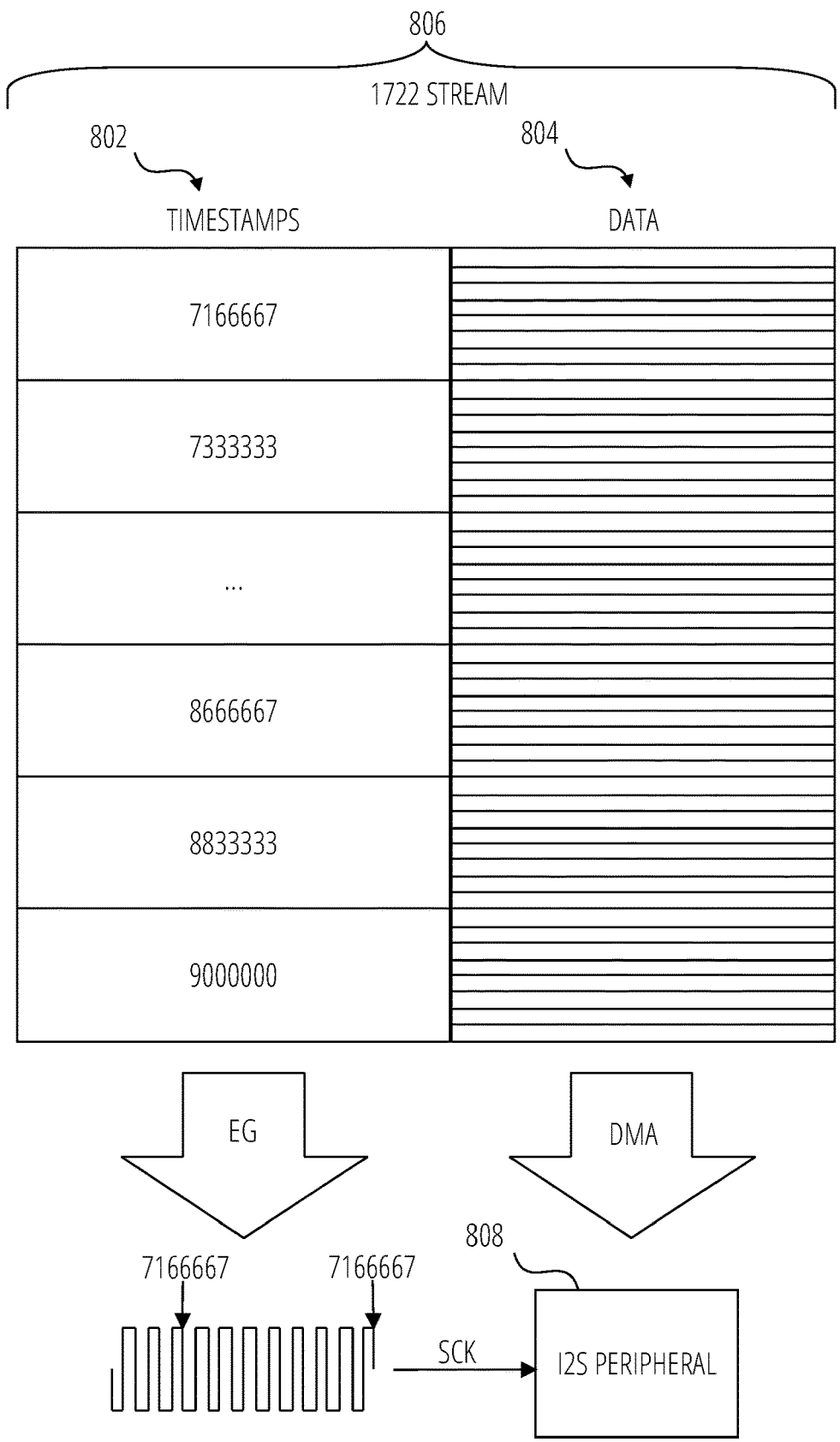
FIG. 8 illustrates a 1722 stream, according to various examples.

FIG. 8 illustrates a 1722 stream 806, according to various examples. The 1722 stream 806 includes timestamps 802 (7166667, 7333333, . . . 866667, 8833333, 9000000) and data 804. According to various examples the timestamps 802 may be synchronized to a serial clock SCK (e.g., identify falling edges of the serial clock SCK that correspond to each of the timestamps 802, without limitation). The data 804 and the serial clock SCK may be provided to an I2S peripheral 808.

For a listener user case, it may be challenging to synchronize the serial clock SCK and the data 804. As a non-limiting example, at the start of I2S streaming, it may be desirable for the data 804 and serial clock SCK to be aligned. An error in alignment between the data 804 and the serial clock SCK at the start of streaming may persist for the entire duration of streaming. In contrast to software solutions, which may only be capable of providing in the range of microsecond precision, hardware solutions disclosed herein may guarantee nanosecond precision without, as a non-limiting example, any real-time requirements for software. An event generator (EG) may trigger a start of a serial clock SCK, which is provided to an I2S peripheral 808, to synchronize the timestamps to the serial clock SCK.

For a talker use case, it may be challenging to synchronize captured FSY-timestamps to the input stream of audio samples. As a non-limiting example, capturing the timestamps may take place asynchronously from the I2S streaming. If the I2S transmitter is the clock master, then a software solution may not reliably recover the relationship between audio samples and their corresponding timestamps.

Figure 9A:
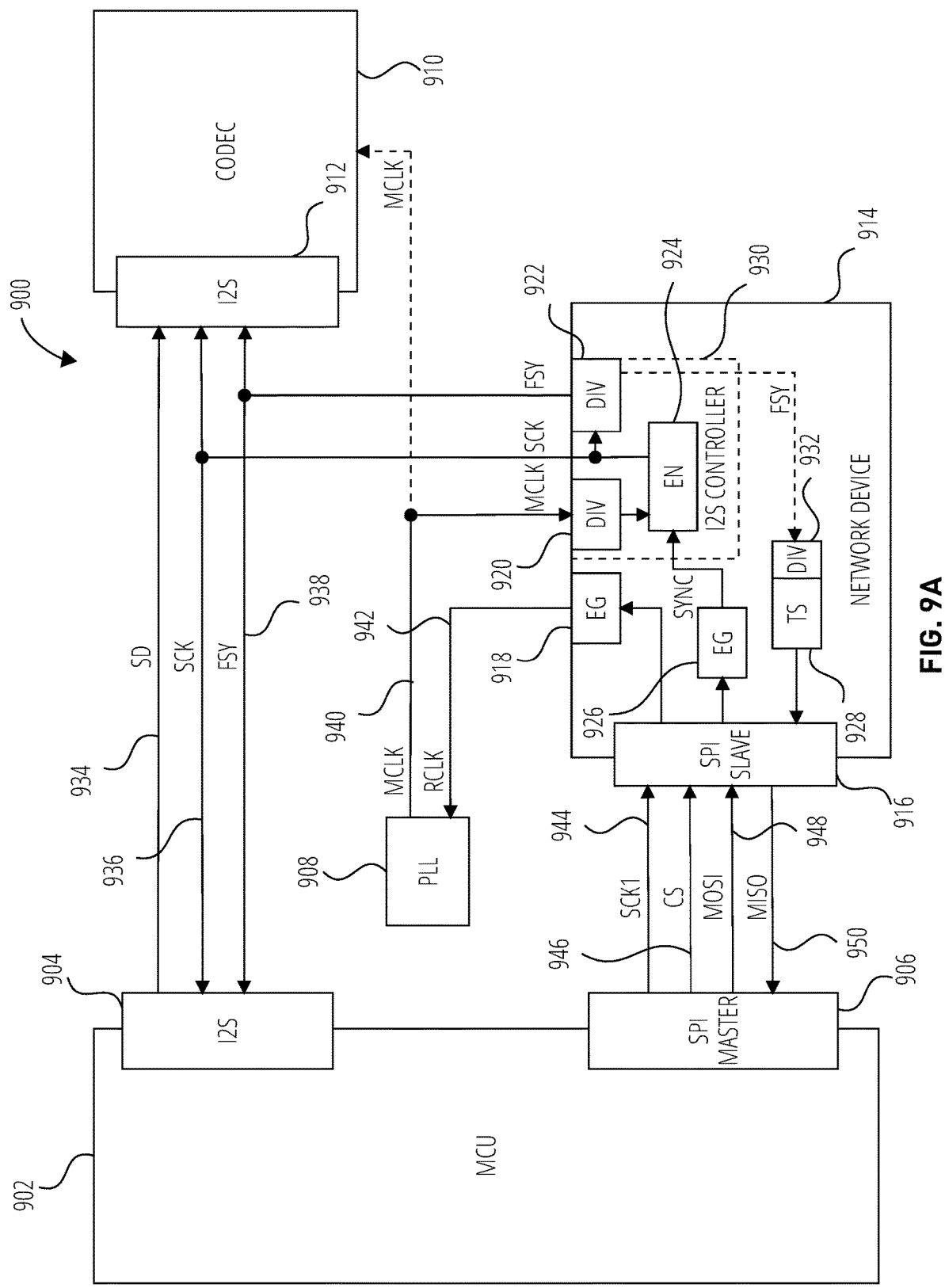
FIG. 9A is a block diagram of an audio system operating with a CODEC as a listener and using a standalone I2S controller, according to various examples.

FIG. 9A is a block diagram of an audio system 900 operating with a CODEC 910 (e.g., an audio device, without limitation) as a listener and using a standalone I2S controller 930, according to various examples. The audio system 900 includes a microcontroller (microcontroller 902), the CODEC 910, a phase-locked loop (PLL 908), and a network device 914. The network device 914 includes the I2S controller 930. The audio system 900 is configured to operate as a controller as master I2S system such as the controller as master I2S system 300 of FIG. 3. In the audio system 900 the microcontroller 902 may operate as an I2S transmitter (e.g., the transmitter 302 of FIG. 3, without limitation), the CODEC 910 may operate as an I2S receiver (e.g., the receiver 304 of FIG. 3, without limitation), and the I2S controller 930 may operate as an I2S controller (e.g., the controller 306 of FIG. 3, without limitation). The I2S controller 930 is implemented in hardware (in contrast to software). Accordingly, the network device 914 may be a standalone controller including the hardware circuitry of the I2S controller 930.

The microcontroller 902 includes an I2S interface 904 and a serial peripheral interface (SPI) master interface (SPI master interface 906). The CODEC 910 includes an I2S interface 912 electrically connected to the I2S interface 904. The audio system 900 includes a digital audio interface including an SD line 934, an SCK line 936, and a frame synchronization (FSY, used interchangeably with WS herein) line (FSY line 938) electrically connecting the I2S interface 912 to the I2S interface 904. Accordingly, the microcontroller 902 is in communication with the CODEC 910 (e.g., an audio device, without limitation) via the serial data (SD) line 934. The microcontroller 902 is configured to transmit a serial digital signal SD to the CODEC 910 on the SD line 934. The serial digital signal SD includes an I2S stream including data and timestamps such as, for example the data 510 and timestamps 508 of the 1722 stream 512 of FIG. 5 and FIG. 6.

The network device 914 includes an SPI slave interface 916 electrically connected to the SPI master interface 906 via a serial clock line 944, a channel select line 946, a master out slave in line 948, and a master in slave out line 950. Accordingly, the network device 914 may be a standalone controller configured to communicate with the microcontroller 902 via a peripheral interface as a peripheral to the microcontroller 902. The network device 914 also includes an I2S controller 930 including a media clock divider 920, a serial clock divider 922 (e.g., 1.5 MHz to 48 kHz, without limitation), and an enable gate 924. The serial clock divider 922 is electrically connected to the serial clock line 944 and the FSY line 938. The serial clock divider 922 is configured to divide the serial clock signal SCK provided to the serial clock line 944 to provide the FSY signal (a word select signal) to the FSY line 938 (a word select line). The network device 914 further includes an event generator 926 electrically connected between the SPI slave interface 916 and the enable gate 924. The network device 914 also includes a timestamp divider 932 electrically connected to the serial clock divider 922, and a time stamper 928 electrically connected to the SPI slave interface 916. The timestamp divider 932 is configured to divide the frame synchronization signal FSY to a rate at which timestamps are provided by the serial data signal SD.

The network device 914 includes an event generator 918 electrically connected between the SPI slave interface 916 and the PLL 908. The event generator 918 is electrically connected to the PLL 908 via a reference clock line 942. The event generator 918 and the PLL 908 may together function as the clock generator 610 of FIG. 6 when the CODEC 910 is operating as a listener. The PLL 908 is configured to receive a reference clock signal RCLK from the event generator 918 and provide a media clock signal MCLK to a media clock divider 920 of the I2S controller 930 (e.g., implemented in hardware circuitry, without limitation).

In operation, the event generator 918 drives the PLL 908. More specifically, the microcontroller 902 may provide timestamps (e.g., the timestamps 508 of FIG. 5, without limitation) to the event generator 918 (e.g., via the SPI master interface 906, the MOSI line, and the SPI slave interface 916, without limitation). For every presentation timestamp the event generator 918 receives, the event generator 918 may generate a pulse, resulting in a reference clock signal RCLK that the event generator 918 provides to the PLL 908 over the reference clock line 942. The PLL 908 may multiply the reference clock signal RCLK to generate a media clock signal MCLK (e.g., an audio bit clock (Nx), without limitation) on a media clock line 940. By way of non-limiting example, the reference clock signal RCLK may pulse at a frequency between substantially 300 Hertz (Hz) and substantially 8 kilohertz (kHz). Also, by way of non-limiting example, the PLL 908 may multiply the reference clock signal RCLK to a media clock signal MCLK of substantially 1.5 MHz for 16-bit stereo. The PLL 908 provides the media clock signal MCLK to the CODEC 910 and the media clock divider 920 via the media clock line 940. The media clock divider 920 is configured to receive and divide the media clock signal MCLK, and provide the divided media clock signal to the enable gate 924.

The enable gate 924 is configured to provide a serial clock signal SCK to the SCK line 936 and a frame synchronization signal FSY to the FSY line 938. The microcontroller 902 and the CODEC 910 are configured to receive the frame synchronization signal FSY (a word select signal) and the serial clock signal SCK provided by the hardware circuitry of the network device 914. The enable gate 924 may be triggered to initiate provision of the serial clock signal SCK and the frame synchronization signal FSY responsive to an assertion (e.g., a pulse, without limitation, without limitation) of a synchronization signal SYNC from the event generator 926. The event generator 926 is configured to assert the synchronization signal SYNC responsive to a presentation timestamp and based at least in part on a synchronized time base (e.g., a wall time, without limitation). Similar to the event generator 918, the event generator 926 may provide a pulse on the synchronization signal SYNC responsive to each presentation timestamp received from the microcontroller 902. By way of non-limiting example, the divided media clock signal from the media clock divider 920 may clock at a frequency suitable for use as the serial clock signal SCK (e.g., 2.5 MHz, without limitation) and the enable gate 924 may pass the divided media clock signal as the serial clock signal SCK to the SCK line 936. The enable gate 924 provides the serial clock signal SCK to the microcontroller 902 (via the SCK line 936 and the I2S interface 904) and to the CODEC 910 (via the SCK line 936 and the I2S interface 912). The enable gate 924 also provides the serial clock signal SCK to the serial clock divider 922, which divides the serial clock signal SCK to generate the frame synchronization signal FSY. The serial clock divider 922 provides the frame synchronization signal FSY to the microcontroller 902 (via the FSY line 938 and the I2S interface 904) and to the CODEC 910 (via the FSY line 938 and the I2S interface 912).

In various examples, audio system 900 enables start of streaming at a specific time by providing the I2S controller 930 with a synchronizable start time point, which is triggered by a pulse of the synchronization signal SYNC. Synchronization is accomplished using event generators (event generator 926 and event generator 918).

Streaming (e.g., transmission of data using the serial data signal SD on the SD line 934, without limitation) initiates at a dedicated timestamp because the synchronization signal SYNC pulses responsive to a timestamp. Once the clocks (the reference clock signal RCLK, the media clock signal MCLK) are running the data may be streamed on the serial data signal SD. Streaming by the microcontroller 902 (i.e., provision of data on the serial data signal SD) may be initiated at the same time that the synchronization signal SYNC is pulsed to initiate provision of the serial clock signal SCK and the frame synchronization signal FSY by the enable gate 924. As a result, the SPI communications from the microcontroller 902 to the network device 914 enable synchronization of the serial clock signal SCK with the streamed data communicated by the serial data signal SD.

Since the serial clock signal SCK runs synchronously, any later synchronization is not required. In various examples, however, the serial clock signal SCK may be monitored (e.g., if it is from an external source, without limitation) to be able to detect issues while the stream is running.

Figure 9B:
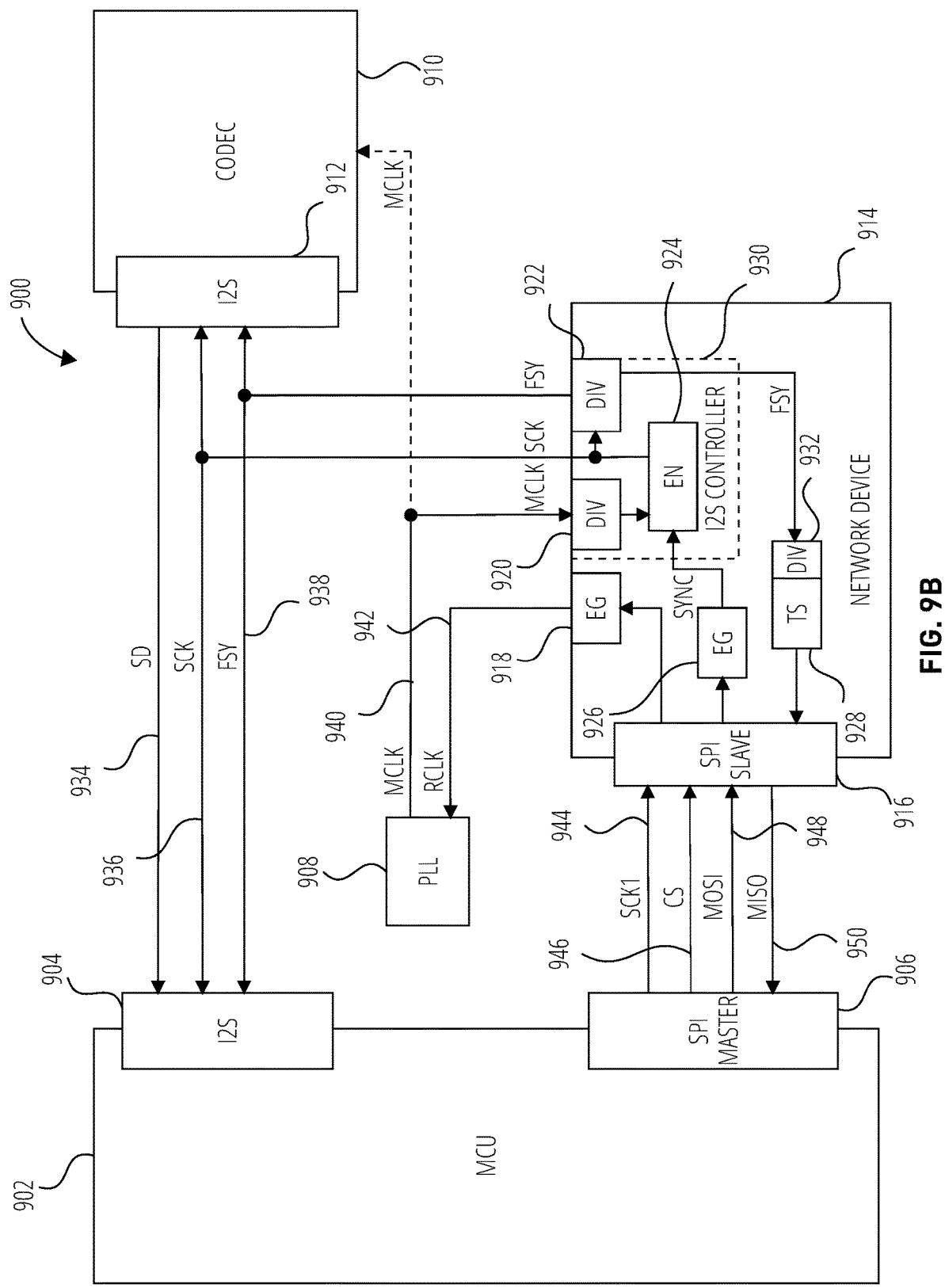
FIG. 9B is a block diagram of the audio system of FIG. 9A with the CODEC operating as a talker, according to various examples.

FIG. 9B is a block diagram of the audio system 900 of FIG. 9A with the CODEC 910 operating as a talker, according to various examples. As discussed above with reference to FIG. 9A, the I2S controller 930 may operate as an I2S controller (e.g., the controller 306 of FIG. 375, without limitation) in a controller as master I2S system (e.g., the controller as master I2S system 300 of FIG. 3, without limitation). In the audio system 900 illustrated in FIG. 9B, however, the microcontroller 902 may operate as an I2S receiver (e.g., the receiver 304 of FIG. 3, without limitation) and the CODEC 910 may operate as an I2S transmitter (e.g., the transmitter 302 of FIG. 3, without limitation). Accordingly, the CODEC 910 may transmit a serial data signal SD (e.g., including the data 510 and the timestamps 508 of the 1722 stream 512 of FIG. 5, without limitation) on the SD line 934 to the microcontroller 902.

As previously discussed, in a talker use case it may be challenging to synchronize captured timestamps (e.g., the timestamps 508 of FIG. 6, without limitation) to an input stream of audio samples (e.g., the data 510 of FIG. 5, without limitation). In various examples, I2S controller 930 enables synchronization of captured time stamps to an input stream of audio samples. The network device 914 recovers the media clock MCLK, and the I2S controller 930 provides the serial clock signal SCK and the frame synchronization signal FSY, as discussed with reference to FIG. 9A. The I2S controller 930 (specifically the serial clock divider 922) provides the frame synchronization signal FSY to the timestamp divider 932, which divides the frame synchronization signal FSY using a timestamp divider 932. The timestamp divider 932 may divide the frame synchronization signal FSY to a rate at which timestamps are provided by the serial data signal SD. A time stamper 928 may provide the divided frame synchronization signal to the microcontroller 902 (e.g., using a master in slave out signal MISO on the master in slave out line 950, without limitation).

Figure 10:
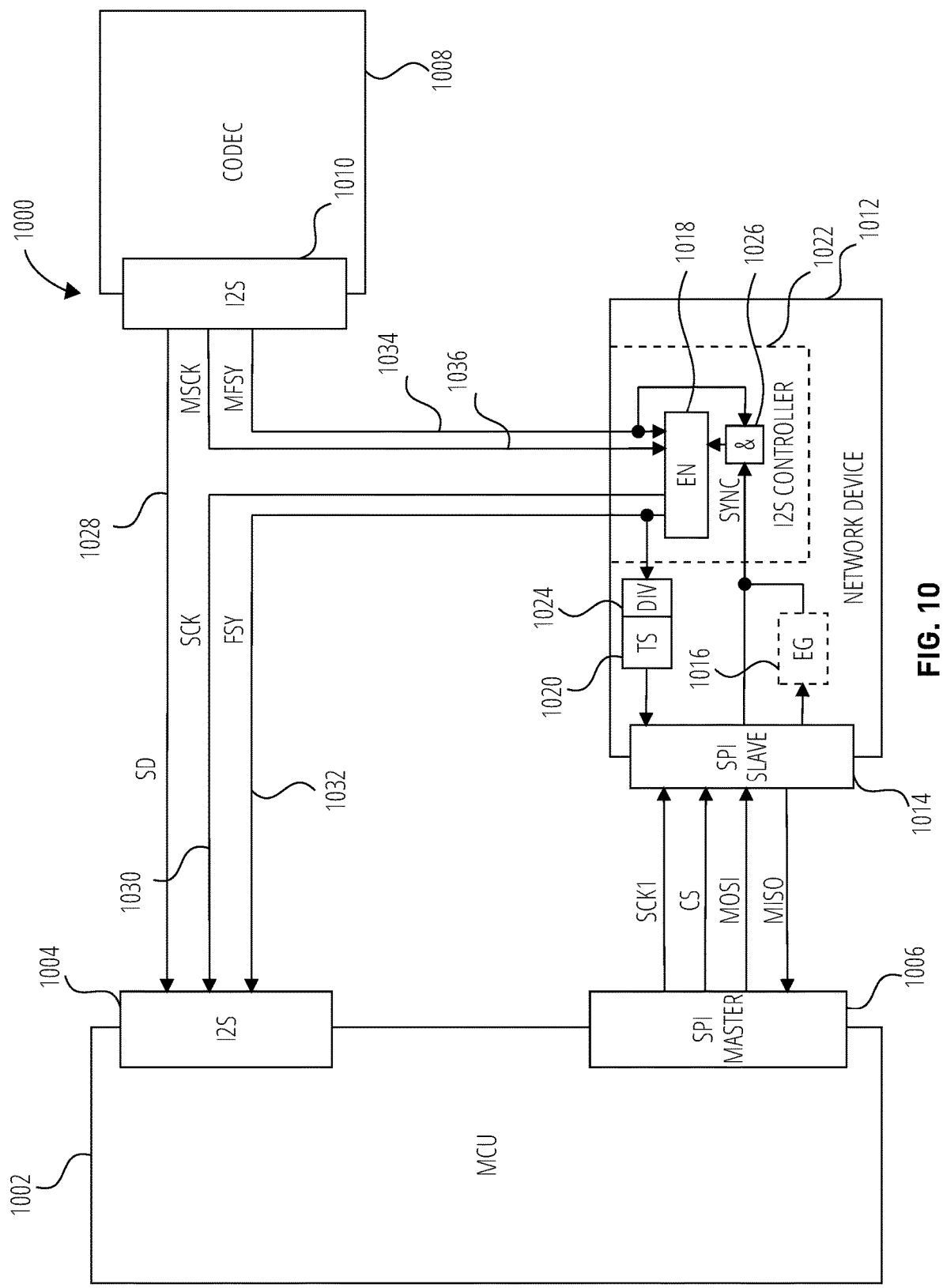
FIG. 10 is a block diagram of another audio system with a CODEC operating as a talker and as a master node, according to various examples.

FIG. 10 is a block diagram of another audio system 1000 with a CODEC 1008 (e.g., an audio device, without limitation) operating as a talker and as a master node, according to various examples. The audio system 1000 includes a microcontroller 1002, a CODEC 1008, and a network device 1012. The microcontroller 1002 is similar to the microcontroller 902 of FIG. 9A and FIG. 9B. For example, the microcontroller 1002 includes an I2S interface 1004 and an SPI master interface 1006 similar to the I2S interface 904 and the SPI master interface 906 discussed above with reference to FIG. 9A and FIG. 9B. The CODEC 1008 is similar to the CODEC 910 of FIG. 9B accept that the CODEC 1008 provides a serial data signal SD to the microcontroller 1002 because the CODEC 1008 is shown as operating as a talker. The CODEC 1008 is also operating as an I2S master node, similar to the transmitter 102 of the transmitter as master I2S system 100 of FIG. 1. As a result, the CODEC 1008 provides a master serial clock signal MSCK and a master frame select signal MFSY to the network device 1012 (e.g., a standalone controller, without limitation). The CODEC 1008 includes an I2S interface 1010 similar to the I2S interface 912 of FIG. 9A and FIG. 9B. The microcontroller 1002 is shown as operating as a receiver, similar to the receiver 104 of FIG. 1.

The network device 1012 of FIG. 10, like the network device 914 of FIG. 9A and FIG. 9B, is implemented in hardware (in contrast to software). The network device 1012 includes an SPI slave interface 1014 similar to the SPI slave interface 916 of FIG. 9A and FIG. 9B electrically connected to the SPI master interface 1006 of the microcontroller 1002. The network device 1012 includes a timestamp divider 1024 and a timestamp generator 1020, which are similar to the time stamper 928 and the timestamp divider 932 of FIG. 9A and FIG. 9B. The network device 1012, however, is different from the network device 914 of FIG. 9A and FIG. 9B. For example, since the network device 1012 is not operating as the I2S master node (the CODEC 1008 is operating as the I2S master node), the network device 1012 does not include circuitry (e.g., the event generator 918 and the PLL 908 of FIG. 9A and FIG. 9B, without limitation) for recovering a reference clock (see the reference clock RCLK of FIG. 9A and FIG. 9B). Also, although the network device 1012 includes an I2S controller 1022, the I2S controller 1022 is different from the I2S controller 930 of FIG. 9A and FIG. 9B.

The network device 1012 includes an I2S controller 1022 including an enable gate EN (enable gate 1018) and an AND gate "&" (AND gate 1026). The enable gate 1018 is configured to receive the master serial clock signal MSCK and the master frame synchronization signal MFSY from the CODEC 1008 (e.g., via the I2S interface 1010, without limitation). The enable gate 1018 is also configured to begin providing the serial clock signal SCK and the frame synchronization signal FSY to the microcontroller 1002 (e.g., via a serial clock line 1030 and a frame synchronization line 1032, respectively, and the I2S interface 1004, without limitation) responsive to a trigger. The network device 1012 also includes an event generator 1016 ("EG"), a timestamp generator 1020 ("TS"), and a timestamp divider 1024 ("DIV").

The CODEC 1008 is configured to provide the serial data signal SD (e.g., including data and timestamps, without limitation) to the microcontroller 1002 via a serial data line 1028. The CODEC 910 is also configured to provide the master serial clock signal MSCK (e.g., via a master serial clock line 1036, without limitation) and the master frame synchronization signal MFSY (e.g., via a master frame synchronization line 1034, without limitation, which may also be referred to herein as a "master word select line") to the enable gate 1018 of the I2S controller 1022. The enable gate 1018 may be triggered immediately or in response to an output signal of the AND gate 1026. Specifically, the event generator 1016 is configured to assert a synchronization signal SYNC responsive to timestamps provided by the microcontroller 1002 to the network device 1012. The microcontroller 1002 may receive the data and timestamps from the CODEC 1008 via the serial data signal SD through the serial data line 1028 and the I2S interface 1004 and provide the timestamps to the event generator 1016 via the SPI master interface 1006, a MOSI signal, and the SPI slave interface 1014.

The AND gate 1026 is configured to receive the synchronization signal SYNC and the master frame synchronization signal MFSY. The AND gate 1026 is configured to trigger the enable gate 1018 to provide the serial clock signal SCK to the serial clock line 1030 responsive to an assertion of the synchronization signal SYNC and an assertion of the master frame synchronization signal MFSY received from the CODEC 1008. Accordingly, the enable gate 1018 is configured to start provision of the serial clock signal SCK and the frame synchronization signal FSY responsive to assertions of the synchronization signal SYNC from the event generator 1016 and the master frame synchronization signal MFSY (a master word select signal).

Since the AND gate 1026 asserts its output to trigger the enable gate 1018 when both the synchronization signal SYNC and the master frame synchronization signal MFSY are asserted, the frame synchronization signal FSY and the serial clock signal SCK provided by the enable gate 1018 are synchronized to the master frame synchronization signal MFSY and the master serial clock signal MSCK provided by the CODEC 1008. Once the microcontroller 1002 receives timestamps via the serial data signal SD from the CODEC 1008 and provides the timestamps to the event generator 1016 (e.g., via a MOSI signal from the SPI master interface 1006 to the SPI slave interface 1014, without limitation), triggering the synchronization signal SYNC, the enable gate 1018 will start providing the serial clock signal SCK and the frame synchronization signal FSY to the microcontroller 1002 at the next master frame synchronization signal MFSY edge (e.g., falling edge, without limitation).

The audio system 1000 may solve the problem of the CODEC 1008 operating as an I2S master mode by enabling of clocks (e.g., the serial clock signal SCK and the frame synchronization signal FSY on the serial clock line 1030 and the frame synchronization line 1032, respectively, without limitation) aligned to the master frame synchronization signal MFSY provided by the CODEC 1008 to be able to match the FSY timestamp to its related audio sample. The AND gate 1026 ensures that the enable gate 1018 does not start providing the serial clock signal SCK and the frame synchronization signal FSY to the microcontroller 1002 until the first edge (e.g., falling edge, without limitation) of the master frame synchronization signal MFSY provided by the CODEC 1008 after the enable gate 1018 confirms (e.g., via an assertion of the synchronization signal, without limitation) that the microcontroller 1002 has received at least a first timestamp.

Gate latency may be timing critical if the serial data signal SD should not be delayed. The enable gate 1018 is configured to provide the serial clock signal SCK and the frame synchronization signal FSY to the microcontroller 1002 via the serial clock line 1030 and the frame synchronization line 1032, respectively. The enable gate 1018 is also configured to provide the frame synchronization signal FSY to the timestamp divider 1024, and the timestamp generator 1020 is configured to generate timestamps corresponding to the audio data communicated in the serial data signal SD. The network device 1012 is configured to provide the timestamps to the microcontroller 1002 via the MISO line.

In various examples where an I2S controller (e.g., the I2S controller 1022 of FIG. 10, without limitation) is not at the master node, such as in the audio system 1000 of FIG. 10, the I2S controller receives an external clock. By way of non-limiting example, the I2S controller 1022 of FIG. 10 receives the master serial clock signal MSCK from the CODEC 1008. The I2S controller may provide some timestamping capability of the frame synchronization signal FSY, and forward the timestamps (e.g., via direct memory access, or "DMA," without limitation) so that the timestamps may be stored synchronously with any incoming audio sample data. The audio sample data may also be divided into blocks of samples, where each block corresponds to a single timestamp, to reduce the number of timestamps that require further processing.

Figure 11:
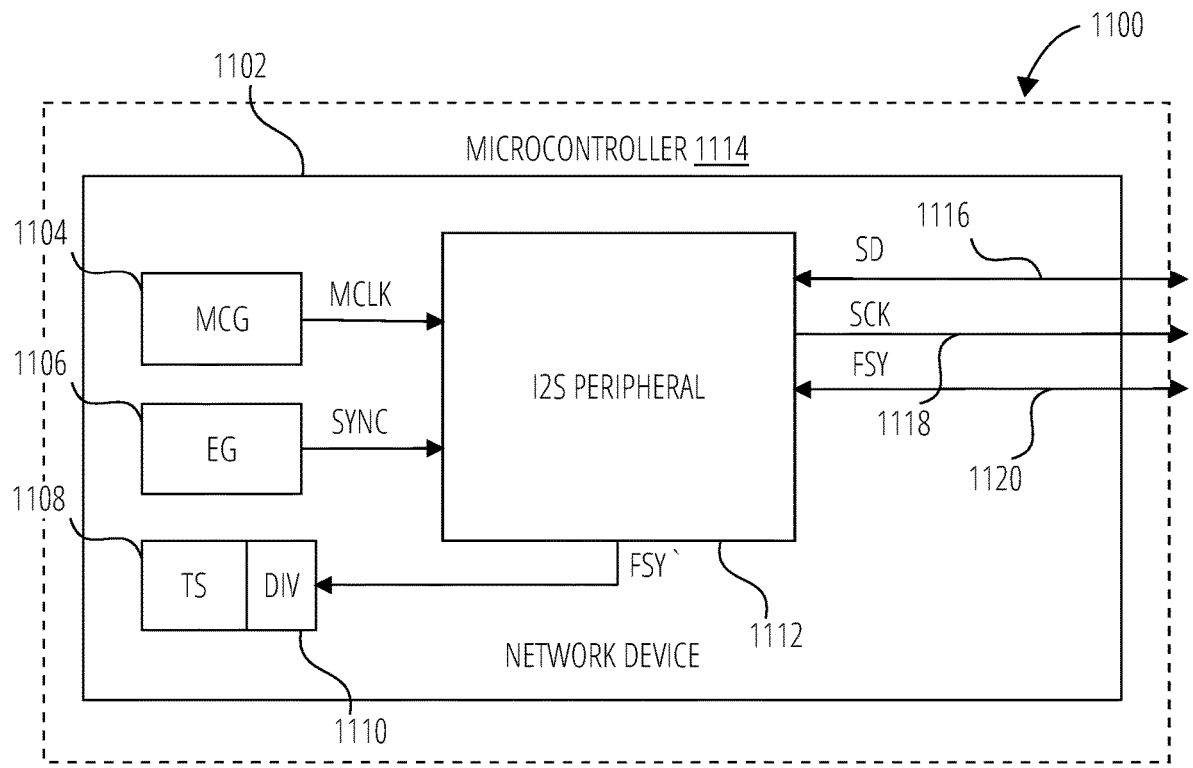
FIG. 11 is a block diagram of an audio system segment including a network device that may be implemented into a microcontroller, according to various examples.

FIG. 11 is a block diagram of an audio system segment 1100 including a network device 1102 that may be implemented into a microcontroller 1114, according to various examples. The network device 1102 may be configured to perform some of the operations that the network device 914 of FIG. 9A and FIG. 9B and the network device 1012 of FIG. 10 are configured to perform. Also, the network device 1102 is implemented in hardware, in contrast to software or firmware similar to the network device 914 and the network device 1012. The audio system segments 1100, however, is implemented into the microcontroller 1114 as a peripheral to a processing core (not shown) of the microcontroller 1114, in contrast to the network device 914 and the network device 1012, which are implemented as standalone controllers separate from their respective microcontrollers (microcontroller 902 of FIG. 9A and microcontroller 1002 of FIG. 10, respectively).

The network device 1102 includes a media clock generator 1104 ("MCG"), an event generator 1106 ("EG"), a timestamp generator 1108 ("TS"), a timestamp divider 1110

("DIV"), and an I2S peripheral 1112. The I2S peripheral 1112 is electrically connected to a serial data line 1116, a serial clock line 1118, and a frame synchronization line 1120. The I2S peripheral 1112 is configured to provide the serial clock signal SCK (e.g., to a codec, without limitation). The I2S peripheral may provide or receive the serial data signal SD and a frame synchronization signal FSY (e.g., to/from the codec, without limitation). The I2S peripheral 1112 may receive a media clock signal MCLK generated by the media clock generator 1104.

With the audio system segment 1100 operating as a talker the I2S peripheral may receive the SD signal from a codec and provide an FSY' signal to the timestamp divider 1110. The timestamp generator 1108 may generate timestamps corresponding to data of the serial data signal SD. The I2S peripheral 1112 may synchronize the timestamps based on the media clock MCLK.

With the network device 1102 operating as a listener the I2S peripheral 1112 may receive a synchronization signal SYNC generated by the event generator 1106. In response the I2S peripheral 1112 may provide the serial data signal SD, the serial clock signal SCK, and the frame synchronization signal FSY to the codec.

In various examples, one or more components discussed for audio system segment 1100 above may be implemented in hardware on the same die with a microcontroller (i.e., separate from a processing core of the microcontroller). An IEEE 1588 wallclock and a PLL may also be implemented on the same die.

The I2S may be directly clocked from the media clock generator 1104 as an internal clock source. Functionality of the I2S controllers of FIG. 9A, FIG. 9B, and FIG. 10 may be merged into the I2S peripheral 1112 of the audio system segment 1100. For example, the media clock generator 1104 may directly deliver the media clock signal MCK to the I2S peripheral 1112, and the timestamp generator 1108 may be connectable to an FSY' output of I2S peripheral 1112.

In various other examples, synchronization logic may be integrated directly into I2S periphery of a microcontroller. Such I2S periphery (e.g., an I2S transmitter, an I2S receiver, an I2S controller, without limitation) in master mode (the microcontroller is the clock source) may then start the synchronous stream at a configurable, dedicated time point. This may be handled by a software workaround, bringing in some additional uncertainty and increasing software complexity.

Figure 12:
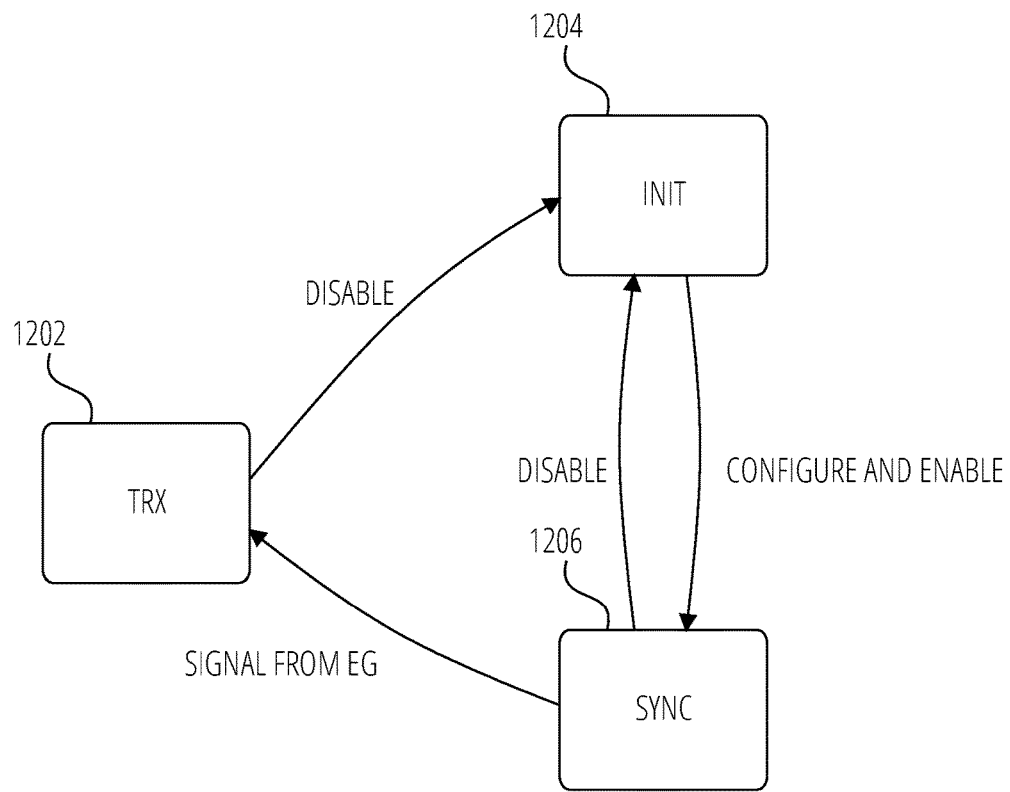
FIG. 12 is a state flow diagram of the audio system segment of FIG. 11, according to various examples.

FIG. 12 is a state flow diagram of the audio system segment 1100 of FIG. 11, according to various examples. The I2S peripheral 1112 (FIG. 11) is extended by a synchronization state machine. In an initial state INIT 1204 the I2S peripheral 1112 (including DMA and event generator 1106) is configured to switch to a synchronization state SYNC 1206. In the synchronization state SYNC 1206 outputs are active, but the serial clock signal SCK will not run until the event generator 1106 triggers a switch to the transmit state TRX 1202. In the transmit state TRX 1202 the serial clock signal SCK and the frame synchronization signal FSY and data transmission are running. Synchronized (gated) frame synchronization signal FSY output results in a case of an external clock source (e.g., frame synchronization signal FSY, without limitation) input.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An audio system, comprising: a word select line of a digital audio interface; a serial clock line of the digital audio interface; and hardware circuitry configured to: provide a word select signal to the word select line, the word select signal configured to indicate channels of a serial data signal provided to a serial data line of the digital audio interface; provide a serial clock signal to the serial clock line; and synchronize the serial clock signal to a clock reference stream of an audio stream communicated via a network interface.

Example 2: The audio system of Example 1, wherein the hardware circuitry includes an enable gate configured to start provision of the serial clock signal responsive to an assertion of a synchronization signal.

Example 3: The audio system of Example 2, wherein the hardware circuitry includes an event generator configured to assert the synchronization signal responsive to a presentation timestamp.

Example 4: The audio system according to any one of Examples 1-3, wherein hardware circuitry is configured to synchronize the serial clock signal at least partially based on a synchronized time base, the synchronized time base including a wallclock time.

Example 5: The audio system according to any one of Examples 1-4, wherein the hardware circuitry includes a serial clock divider electrically connected to the serial clock line and the word select line, the serial clock divider configured to divide the serial clock signal provided to the serial clock line to provide the word select signal to the word select line.

Example 6: The audio system according to any one of Examples 1-5, wherein the hardware circuitry includes a timestamp divider configured to divide the word select signal to a rate at which timestamps are provided by the serial data signal.

Example 7: The audio system according to any one of Examples 1-6, comprising a standalone controller including the hardware circuitry.

Example 8: The audio system of Example 7, comprising: an audio device; and a microcontroller electrically connected to the audio device via the serial data line of the digital audio interface, the microcontroller and the audio device configured to receive the word select signal and the serial clock signal provided by the hardware circuitry.

Example 9: The audio system of Example 8, wherein the standalone controller is configured to communicate with the microcontroller via a peripheral interface as a peripheral to the microcontroller.

Example 10: The audio system according to any one of Examples 8 and 9, further comprising a phase locked loop configured to receive a reference clock signal and provide a media clock signal to a media clock divider of the hardware circuitry.

Example 11: The audio system according to any one of Examples 8 and 9, wherein: the audio device is configured to operate as a master talker node; the standalone controller is configured to receive a master serial clock signal and a master word select signal from the audio device; the hardware circuitry includes an enable gate configured to start provision of the serial clock signal responsive to assertions of a synchronization signal from an event generator and the master word select signal.

Example 12: The audio system according to any one of Examples 1-6, comprising a microcontroller including the hardware circuitry implemented as a peripheral to a processing core of the microcontroller.

Example 13: Circuitry for controlling timing of communications, the circuitry comprising: a serial clock line; an enable gate electrically connected to the serial clock line, the enable gate configured to start provision of a serial clock signal to the serial clock line based, at least in part, on an assertion of a synchronization signal; and an event generator configured to assert the synchronization signal responsive to a presentation time stamp from a serial data signal, the presentation time stamp correlated to a synchronized time base, the enable gate and the event generator implemented using hardware circuitry.

Example 14: The circuitry of Example 13, wherein the hardware circuitry is implemented within a microcontroller as a peripheral to a processing core of the microcontroller.

Example 15: The circuitry of Example 13, wherein the hardware circuitry is implemented within a standalone controller separate from a microcontroller.

Example 16: The circuitry of Example 15, comprising a communication interface configured to electrically connect the standalone controller to the microcontroller, the event generator configured to receive the presentation time stamp from the microcontroller through the communication interface.

Example 17: The circuitry according to any one of Examples 13-16, comprising: a word select line configured to conduct a word select signal; and a timestamp divider electrically connected to the word select line, the timestamp divider configured to divide the word select signal to a rate at which timestamps are provided by the serial data signal.

Example 18: The circuitry according to any one of Examples 13-17, comprising: a master word select line configured to deliver a master word select signal from a master node to the enable gate; and an AND gate configured to receive the synchronization signal and the master enable gate, the AND gate configured to trigger the enable gate to provide the serial clock signal to the serial clock line responsive to the assertion of the synchronization signal and an assertion of the word select signal.

Example 19: The circuitry according to any one of Examples 13-18, wherein the enable gate is configured to provide the serial clock signal to the serial clock line responsive to the assertion of the synchronization signal.

Example 20: The circuitry according to any one of Examples 13, 15-17, and 19, wherein the hardware circuitry is configured to provide the serial clock signal and a word select signal as a standalone controller and as a master node.

Example 21: An audio system, comprising: a word select line of a digital audio interface; a serial clock line of the digital audio interface; and hardware circuitry configured to: provide a word select signal to the word select line, the word select signal configured to indicate channels of a serial data signal provided to a serial data line of the digital audio interface; provide a serial clock signal to the serial clock line; and synchronize, at least partially based on a synchronized time base, the serial clock signal to a clock reference stream of an audio stream communicated via a network interface.

Example 22: The audio system of Example 21, further comprising a standalone controller including the hardware circuitry.

Example 23: The audio system of Example 22, further comprising: an audio device; and a microcontroller electrically connected to the audio device via the serial data line of the digital audio interface, the microcontroller configured to receive the word select signal and the serial clock signal provided by the hardware circuitry.

Example 24: The audio system of Example 23, wherein: the microcontroller is configured to generate the serial data signal responsive to the audio stream received via the network interface; the microcontroller is configured to provide the serial data signal to the audio device via the serial data line; and the hardware circuitry is configured to synchronize a starting point at which the audio stream is to be presented by the audio device.

Example 25: The audio system of Example 23, wherein: the audio device is configured to provide the serial data signal to the microcontroller via the serial data line; and the microcontroller is configured to provide the clock reference stream and the audio stream to the network interface.

Example 26: The audio system according to any one of Examples 23-25, wherein the standalone controller is configured to communicate with the microcontroller via a peripheral interface as a peripheral to the microcontroller.

Example 27: The audio system according to any one of Examples 23-26, wherein the standalone controller includes an enable gate configured to enable the serial clock.

Example 28: The audio system of Example 27, wherein the enable gate is configured to be triggered by an event generator.

Example 29: The audio system according to any one of Examples 23-28, further comprising a phase locked loop configured to receive a reference clock and provide a media clock to a clock divider of the hardware circuitry.

Example 30: The audio system according to any one of Examples 23-29, wherein the audio device is also configured to receive the serial clock signal and the word select signal provided by the hardware circuitry.

Example 31: The audio system of Example 23, wherein: the audio device is configured to provide the serial clock signal and the word select signal to the hardware circuitry; and the hardware circuitry is configured to provide the serial clock signal and the word select signal to the microcontroller by relaying the serial clock signal and the word select signal received from the audio device to the serial clock line and the word select line, respectively.

Example 32: The audio system of Example 21, further comprising a microcontroller including the hardware circuitry as a peripheral controller.

Example 33: The audio system of Example 32, further comprising an audio device electrically connected to the hardware circuitry via the word select line and the serial clock line.

Example 34: The audio system according to any one of Examples 32 and 33, wherein the microcontroller includes a media clock generator, an event generator including a phase locked loop, and a timestamp generator.

Example 35: The audio system according to any one of Examples 21-34, wherein the synchronized clock base comprises a wallclock time.

Example 36: The audio system according to any one of Examples 21-35, wherein the clock reference stream and the audio stream comprise an International Electrical and Electronics (IEEE) 1722 stream.

Example 37: The audio system according to any one of Examples 21-36, wherein the network interface includes a wired network interface.

Example 38: The audio system of Example 37, wherein the wired network interface includes an Ethernet interface.

Example 39: The audio system according to any one of Examples 21-38, wherein the audio system includes an automobile audio system.

Example 40: The audio system according to any one of Examples 21-39, wherein the audio system includes a surround sound system.

CONCLUSION

As used in the present disclosure, the terms "module" or "component" may refer to specific hardware implementations configured to perform the actions of the module or component or software objects or software routines that may be stored on or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads, without limitation). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An audio system, comprising: a word select line of a digital audio interface; a serial clock line of the digital audio interface; and hardware circuitry that is free of software elements such as executable software or firmware code, the hardware circuitry to: provide a word select signal to the word select line, the word select signal indicating channels of a serial data signal provided to a serial data line of the digital audio interface; provide a serial clock signal to the serial clock line; and synchronize provision of the serial clock signal to the serial clock line with a clock reference stream of an audio stream communicated via a network interface, the clock reference stream comprising multiple timestamps, wherein the hardware circuitry is to synchronize the serial clock signal at least partially based on a synchronized time base, the synchronized time base including a wallclock time.

2. The audio system of claim 1, wherein the hardware circuitry includes an enable gate to start provision of the serial clock signal responsive to an assertion of a synchronization signal.

3. The audio system of claim 2, wherein the hardware circuitry includes an event generator to assert the synchronization signal responsive to a presentation timestamp.

4. The audio system of claim 1, wherein the hardware circuitry includes a serial clock divider electrically connected to the serial clock line and the word select line, the serial clock divider to divide the serial clock signal provided to the serial clock line to provide the word select signal to the word select line.

5. The audio system of claim 1, wherein the hardware circuitry includes a timestamp divider to divide the word select signal to a rate at which timestamps are provided by the serial data signal.

6. The audio system of claim 1, comprising a standalone controller including the hardware circuitry.

7. The audio system of claim 6, comprising:
an audio device; and
a microcontroller electrically connected to the audio device via the serial data line of the digital audio interface, the microcontroller and the audio device to receive the word select signal and the serial clock signal provided by the hardware circuitry.

8. The audio system of claim 7, wherein the standalone controller is to communicate with the microcontroller via a peripheral interface as a peripheral to the microcontroller.

9. An audio system, comprising:
a word select line of a digital audio interface;
a serial clock line of the digital audio interface;
a standalone controller including a hardware circuitry that is free of software elements such as executable software or firmware code, the hardware circuitry to:
provide a word select signal to the word select line, the word select signal indicating channels of a serial data signal provided to a serial data line of the digital audio interface;
provide a serial clock signal to the serial clock line; and
synchronize provision of the serial clock signal to the serial clock line with a clock reference stream of an audio stream communicated via a network interface, the clock reference stream comprising multiple timestamps;
an audio device;
a microcontroller electrically connected to the audio device via the serial data line of the digital audio interface, the microcontroller and the audio device to receive the word select signal and the serial clock signal provided by the hardware circuitry; and
a phase locked loop to receive a reference clock signal and provide a media clock signal to a media clock divider of the hardware circuitry.

10. The audio system of claim 7, wherein:
the audio device is to operate as a master talker node;
the standalone controller is to receive a master serial clock signal and a master word select signal from the audio device; and
the hardware circuitry includes an enable gate to start provision of the serial clock signal responsive to assertions of a synchronization signal from an event generator and the master word select signal.

11. The audio system of claim 1, comprising a microcontroller including the hardware circuitry implemented as a peripheral to a processing core of the microcontroller.

12. Circuitry for controlling timing of communications, the circuitry comprising:
a serial clock line;
an enable gate electrically connected to the serial clock line, the enable gate to start provision of a serial clock signal to the serial clock line based, at least in part, on an assertion of a synchronization signal;
an event generator to assert the synchronization signal responsive to a presentation time stamp from a serial data signal, the presentation time stamp correlated to a synchronized time base, the enable gate and the event generator implemented using hardware circuitry; and
a communication interface to electrically connect a standalone controller to a microcontroller, the event generator to receive the presentation time stamp from the microcontroller through the communication interface,
wherein the hardware circuitry is implemented within the standalone controller separate from the microcontroller.

13. The circuitry of claim 12, wherein the hardware circuitry is implemented within the microcontroller as a peripheral to a processing core of the microcontroller.

14. The circuitry of claim 12, comprising:
a word select line to conduct a word select signal; and
a timestamp divider electrically connected to the word select line, the timestamp divider to divide the word select signal to a rate at which timestamps are provided by the serial data signal.

15. The circuitry of claim 12, comprising:
a master word select line to deliver a master word select signal from a master node to the enable gate; and
an AND gate to receive the synchronization signal and the master word select signal, the AND gate to trigger the enable gate to provide the serial clock signal to the serial clock line responsive to the assertion of the synchronization signal and an assertion of the master word select signal.

16. The circuitry of claim 12, wherein the enable gate is to provide the serial clock signal to the serial clock line responsive to the assertion of the synchronization signal.

17. The circuitry of claim 12, wherein the hardware circuitry is to provide the serial clock signal and a word select signal as a standalone controller and as a master node.

* * * * *

UNITED STATES PATENT AND TRADEMARK OFFICE
CERTIFICATE OF CORRECTION

PATENT NO. : 12,062,385 B2
APPLICATION NO. : 17/305561
DATED : August 13, 2024
INVENTOR(S) : Michael Rentschler and Thorben Link It is certified that error appears in the above-identified patent and that said Letters Patent is hereby corrected as shown below:

In the Specification

Column 10, Line 62, change "signal MCLK, and" to --signal MCLK and--

In the Claims

Claim 1, Column 20, Lines 26-41, change "An audio system, comprising: a word select line of a digital audio interface; a serial clock line of the digital audio interface; and hardware circuitry that is free of software elements such as executable software or firmware code, the hardware circuitry to: provide a word select signal to the word select line, the word select signal indicating channels of a serial data signal provided to a serial data line of the digital audio interface; provide a serial clock signal to the serial clock line; and synchronize provision of the serial clock signal to the serial clock line with a clock reference stream of an audio stream communicated via a network interface, the clock reference stream comprising multiple timestamps, wherein the hardware circuitry is to synchronize the serial clock signal at least partially based on a synchronized time base, the synchronized time base including a wallclock time." to
--An audio system, comprising:
a word select line of a digital audio interface;
a serial clock line of the digital audio interface; and
hardware circuitry that is free of software elements such as executable software or
    firmware code, the hardware circuitry to:
provide a word select signal to the word select line, the word select signal
    indicating channels of a serial data signal provided to a serial data line of
    the digital audio interface;
provide a serial clock signal to the serial clock line; and
synchronize provision of the serial clock signal to the serial clock line with a
    clock reference stream of an audio stream communicated via a network
    interface, the clock reference stream comprising multiple timestamps, Signed and Sealed this
Fifteenth Day of October, 2024

*Katherine Kelly Vidal*
*Director of the United States Patent and Trademark Office* wherein the hardware circuitry is to synchronize the serial clock signal at least partially based on a synchronized time base, the synchronized time base including a wallclock time.--